United States Patent

O'Brien et al.

Patent Number: 5,270,869
Date of Patent: Dec. 14, 1993

[54] PASSIVELY ATHERMALIZED OPTICAL ASSEMBLY INCORPORATING LAMINATE FIBER COMPENSATION RING

[75] Inventors: Michael J. O'Brien; William B. Smith, both of Rochester, N.Y.

[73] Assignee: Eastman Kodak Company, Rochester, N.Y.

[21] Appl. No.: 996,226

[22] Filed: Dec. 23, 1992

[51] Int. Cl.$^5$ ............................................. G02B 7/02
[52] U.S. Cl. ...................... 359/820; 359/641; 372/36; 385/33
[58] Field of Search ............... 359/823, 819, 820, 641; 385/32, 33; 372/36

[56] References Cited

U.S. PATENT DOCUMENTS

| | | | |
|---|---|---|---|
| 4,525,745 | 6/1985 | Ghaem-Maghami et al. | 358/237 |
| 4,604,753 | 8/1986 | Sawai | 372/36 |
| 4,656,635 | 4/1987 | Baer et al. | 372/69 |
| 4,730,335 | 3/1988 | Clark et al. | 372/98 |
| 4,850,674 | 7/1989 | Hasselskog | 359/820 |
| 4,861,137 | 8/1989 | Nagata | 359/820 |
| 4,993,801 | 2/1991 | Sarraf | 359/641 |

FOREIGN PATENT DOCUMENTS

| | | | |
|---|---|---|---|
| 2830341 | 7/1978 | Fed. Rep. of Germany. | |
| 58-203405 | 11/1983 | Japan | 359/820 |
| 59-15204 | 1/1984 | Japan | 359/820 |
| 59-15205 | 1/1984 | Japan | 359/820 |
| 127800 | 3/1919 | United Kingdom | 359/820 |
| 1325936 | 12/1919 | United Kingdom | 359/820 |

*Primary Examiner*—Loha Ben
*Attorney, Agent, or Firm*—Thomas H. Close; Mark Z. Dudley

[57] ABSTRACT

Apparatus for providing athermalized collimation of a light beam source by a light beam collimator includes beam source support for fixing the beam source at a predetermined position thereon and for thereby defining a light beam optical axis; collimator support for aligning the collimator at a beam collimator position on the optical axis; and thermal compensator operatively connected between the beam source support and the collimator support. The thermal compensator is operable to selectively displace the collimator along the optical axis and thereby displace the collimator. In a particular feature of the invention, the thermal compensator comprises a composite laminate construction of fiber strands, wherein the coefficient of thermal expansion α of the thermal compensator is determined by the alignment of the fiber strands.

16 Claims, 2 Drawing Sheets

PASSIVELY ATHERMALIZED OPTICAL ASSEMBLY INCORPORATING LAMINATE FIBER COMPENSATION RING

BACKGROUND OF THE INVENTION

The present invention relates to means for effecting temperature-compensation of focal length in an optical assembly.

Certain optical assemblies such as those found in laser beam output scanners require a stable monochromatic collimated light beam provided by a beam source, such as a laser diode, and a collimating lens. For adequate optical performance, the beam source must maintain a predetermined beam quality over a wide ambient temperature range. The relative position between the collimating lens and beam source, known as the back focal length, must be maintained over a substantial range of ambient temperature variation. The allowable variance of this back focal length depends on the resolution of the scanner. The successful implementation of a very high resolution (e.g., 1,000 dpi) laser beam output scanner may, for example, tolerate no more than 20 microinches of back focal length deviation.

In conventional approaches to the problem, the beam source and lens are mounted in a mechanical structure that attempts to maintain the back focal length while the apparatus undergoes temperature-induced structural changes. Hence, the athermalization (i.e., thermal compensation) of the beam source is effected either passively or actively.

Passive compensation systems typically rely on the differences in coefficients of thermal expansions of the various elements in the optical system such that there is minimal net focus shift with temperature. The conventional approach is to employ concentric tube systems, which, if constructed from common materials, are too large or bulky. For example, U.S. Pat. No. 4,730,335 discloses a series of interlocking tubes each carrying a single optical element of an optically-pumped solid-state laser. However, the accuracy of a passive system will depend upon the CTE of the materials chosen for the construction of certain components of the system. Thus, some passive designs cannot be manufactured because the desired CTE is simply not exhibited by the materials suited for fabricating the requisite system components, or because the desired CTE is available but only in materials that are unstable, thus rendering a system response that is inaccurate, unstable, or unreliable.

SUMMARY OF THE INVENTION

A preferred embodiment of an apparatus for providing athermalized collimation of a light beam source by a light beam collimating means may be constructed according to the present invention to include beam source support means for fixing the beam source at a predetermined position thereon and for thereby defining a light beam optical axis; collimating means support for aligning the collimating means at a beam collimating means position on the optical axis; and thermal compensation means operatively connected between the beam source support means and the collimating means support. The thermal compensation means is operable to selectively displace the collimating means along the optical axis and thereby displace the collimating means. In a particular feature of the present invention, the thermal compensation means comprises a composite laminate construction of fiber strands, wherein the coefficient of thermal expansion $\alpha$ of the thermal compensation means is determined by the alignment of the fiber strands.

These and other aspects, objects, features and advantages of the present invention will be more clearly understood and appreciated from a review of the following detailed description of the preferred embodiments and appended claims, and be reference to the accompanying drawings.

DETAILED DESCRIPTION OF THE PREFERRED EMBODIMENTS

Figure 1:
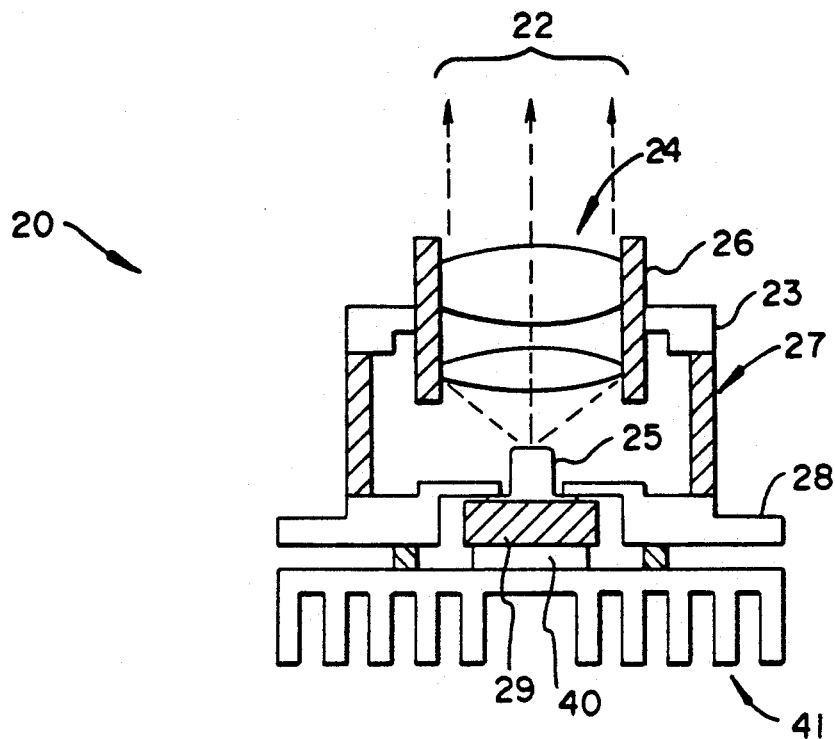
FIGS. 1 and 2 are simplified side sectional views of an optical assembly constructed according to the present invention.

Preferred embodiments of the present invention will now be described with reference to the accompanying drawings, wherein like reference numerals refer to like components.

As shown in FIG. 1, a preferred embodiment of the present invention may be constructed as an athermalized optical assembly 20 for use in providing a collimated light beam 22 of essentially constant quality over a wide range of operating temperature. A front plate 23 holds a collimating lens 24, located in the lens barrel 26, the combination of which are supported by a compensation ring 27 aligned with the optical axis of a light beam 22 from a beam source 25. The beam source 25 is preferably in the form of a semiconductor laser diode fixed in a beam source mount 29 that is integral with a base plate 28. Radial and angular alignment of the lens 24 to the beam source 25 is maintained due to the coaxially aligned, cylindrical geometry of the front plate 23, base plate 28, beam source mount 29, and compensation ring 27.

The beam source mount 29 and thus the beam source 25 are cooled by a thermal element, preferably in the form of a thermo-electric cooler (TEC) module 40 and heatsink 41 to maintain the beam source at a constant temperature for optimum performance. The thermal element is mounted to the back surface of the beam source mount 29. The thermal element includes a central passage 42 for the provision of appropriate power and control signal conductors (not shown) to the beam source 25.

A preferred beam source 25 is a laser diode commercially available as the Hitachi Model HL7806G laser diode. The thermal element 40 is preferably a thermo-electric cooler (TEC) module 40 commercially available as the Marlow Industries Model SD1507 (modified to include a center hole for wire routing) that is clamped or cemented between the beam source mount 29 and a black anodized aluminum radial fin heat sink 41. The collimating lens 24 is preferably a lens commercially available from Eastman Kodak Company as the Model Q-28 collimating lens. The front plate 23 and base plate 28 are preferably constructed of no. 316 stainless steel. Insulating means (not shown) would also be preferred between the base plate and any external frame members to thermally isolate the entire optical assembly 20. With the exception of the particular teachings herein, the assembly 20 is contemplated as being manufactured, aligned, and focussed according to optical techniques known in the art.

Figure 2:
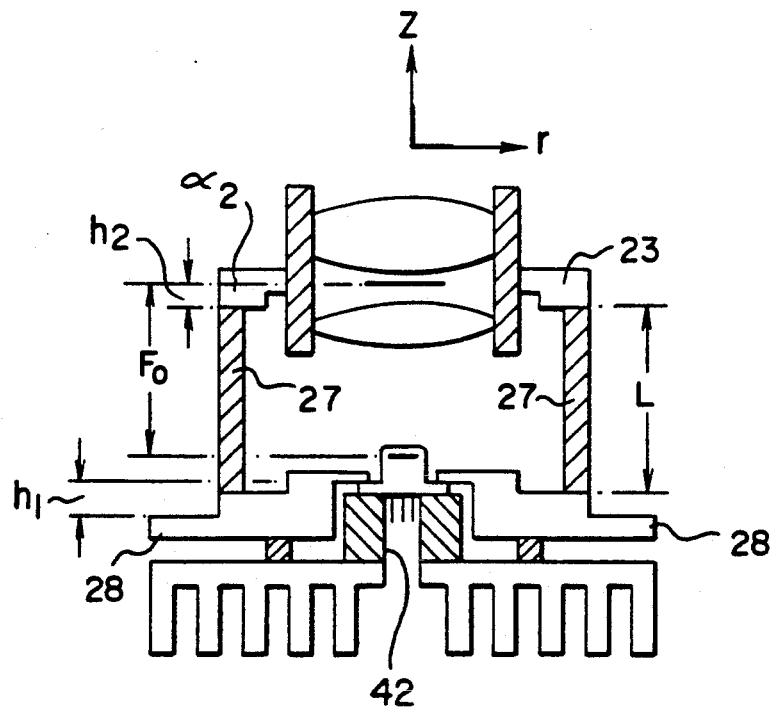

Therefore, with reference now to FIG. 2, the pertinent design parameters of the preferred embodiment will be understood. As the design objective is to maintain the focal distance $F_O$ constant over a wide temperature range, the materials that form the base plate 28, compensation ring 27, and lens barrel 26 are chosen such that the thermal focal shift dZ (inches/degree F.) is:

$$dZ = L\alpha_3 + h_1\alpha_1 + h_2\alpha_2 \qquad [1]$$

where:
- $\alpha_1$ = coefficient of thermal expansion of the base plate 28
- $\alpha_2$ = coefficient of thermal expansion of the front plate 23
- $\alpha_3$ = coefficient of thermal expansion of the compensation ring 27
- L = height of the compensation ring 27
- $h_1$ = reference thickness of the base plate 28
- $h_2$ = distance of the collimating lens focal point to the upper end of the compensation ring 27

Generally the dimensions L, $h_1$, $h_2$ are fixed by the space limitations, and vary with each application.

Figure 4:
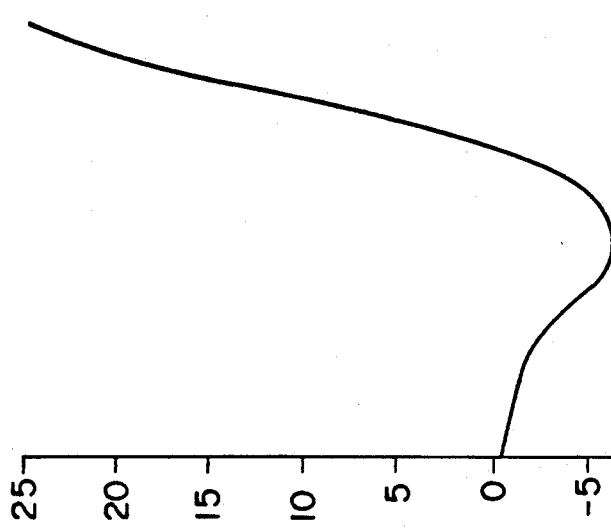
FIG. 4 is a simplified graphical representation of the change in coefficient of thermal expansion (CTE) according to wrap angle in the fibers of the compensation ring in the optical assembly of FIG. 1.
Figure 3:
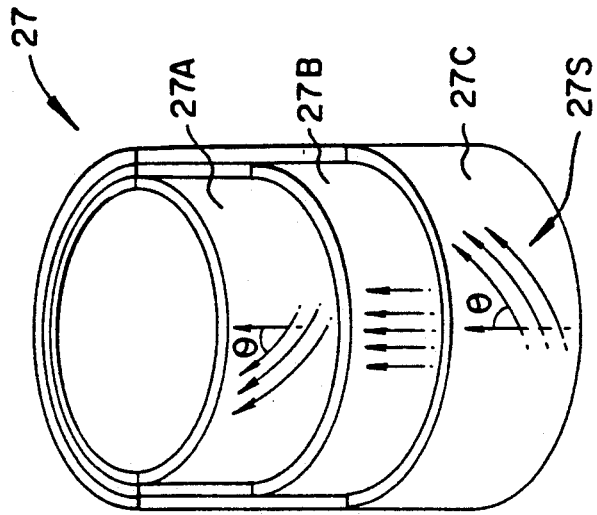
FIG. 3 is a simplified diagrammatic model useful in the analysis of the support tube in the optical assembly of FIG. 1.

As will now be appreciated with reference to FIGS. 3-4, it is a particular feature of the present invention that the front plate 23 and base plate 28 are separated by a compensation ring 27 having a particular composite laminate construction. The laminate thickness is constructed with minimal thickness to reduce bending moments in either plates. Multiple layers of laminae fiber orientations are configured to yield a selectable range of positive or negative coefficients of thermal expansion (CTE) that heretofore have been difficult or impossible to achieve in conventional apparatus. Accordingly, the designer of a passively athermalized optical assembly, in following the teachings of the present invention, will find a greater range of CTE values available in the embodiments described herein.

FIG. 3 illustrates a preferred embodiment of the compensation ring 27. FIG. 4 illustrates the range of $\alpha_3$ (the coefficient of thermal expansion for the compensation ring) that may be selected according to the wrap angle $\theta$ of the fiber strands 27S in the component fiber layers 27A, 27B, and 27C. (As illustrated, only a portion of strands 27S are shown for clarity, and the strands of component layer 27B have a wrap angle=0.) This composite tube construction allows one to select the desired value of $\alpha_3$ for the compensation ring 27 by varying the wrap angles of the strands in the inner layer 27A and the outer layer 27C while maintaining the strands of the middle layer 27B in a zero wrap angle (i.e., oriented in parallel with the longitudinal axis of the compensation ring).

The compensation ring is preferably a composite made of plural carbon fibers having a modulus of 33 msi, with a Polyphenylene Sulfide matrix, in a precision wrap configuration. Such a matrix may be formed as a layup with unidirectional graphite/polyphenylene sulfide layers. The aforementioned composite material is commercially available from Polymer Composites Incorporated. However, it is contemplated that other similar fiber materials, and other fiber/laminate combinations, will yield similar (although potentially less optimal) results.

To compensate for the dimensional changes in the several components of the optical assembly 20, as may be expected according to thermal/mechanical effects known in the art, such as the thermally-induced motions of the front plate and base plate, the required coefficient of thermal expansion $\alpha_3$ for the compensation ring 27 is calculated according to equation [2], as follows:

$$\alpha_3 = (dZ - h_1\alpha_1 - h_2\alpha_2)/L \qquad [2]$$

Thus, by selection of a wrap angle $\theta$ for each component layer 27A, 27B, and 27C as determined from the graph in FIG. 4, the laminae fiber strands offer a combined, effective coefficient of thermal expansion suitable for the desired coefficient of thermal expansion $\alpha_3$.

Figure 5:
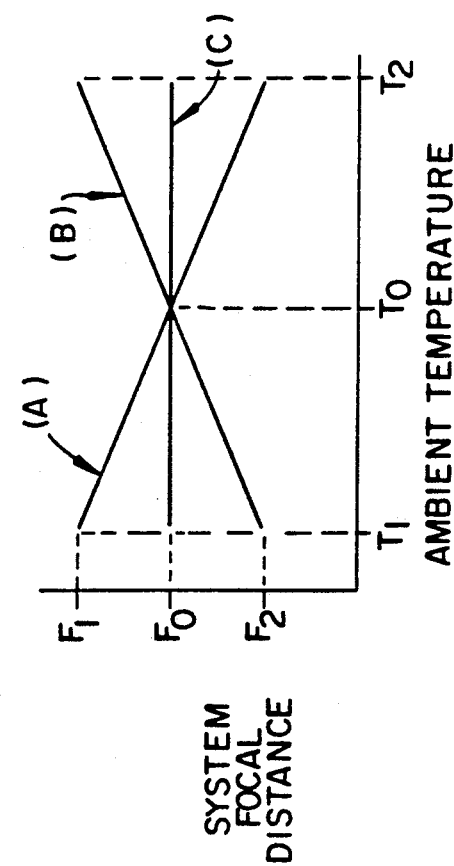
FIG. 5 is a graphical representation of the change in focal distance of the assembly of FIG. 1 according to ambient temperature.

FIG. 5 illustrates the effect of the resulting lens motion and focal shift on the effective focal distance over the operating range of the optical assembly 20. The system optical focus shift (illustrated as line A) includes the effects of changes in lens focal length and the relative beam source position. The expansion or contraction of the compensation ring 27 causes a collimating lens position shift (line B) that exactly compensates the focus shift (line A), whereby the focal distance (line C) of the collimated light beam 22, and hence the beam spot size at the optical assembly focal plane (not shown), will be maintained over the entire operating range $T_1-T_2$ of the optical assembly. Due to the nature of the collimating lens construction, the collimating lens position shift (line B) is linear; although a positive shift is illustrated, the shift may be either positive or negative according to the selection of the wrap angles discussed hereinabove. Thus, the contemplated optical assembly may be constructed so as to fully compensate for focus shifts at temperatures below (e.g., $T_1$) and above (e.g., $T_2$) the normal operating value ($T_0$).

An athermalized optical assembly constructed according to the present invention affords the following, and other, benefits and advantages. The components of the assembly may be easily produced and can be successfully designed to minimize component sensitivity to manufacturing tolerances. The assembly may be standardized in a compact size that is nonetheless suitable for addressing a wide range of thermal compensation requirements. The compact design has less mass, thus allowing faster thermal response. In contrast to the limited range of CTE values available for compensation in prior art passive compensation schemes, the present invention allows optimal thermal compensation by accurate control of $\alpha_3$, the coefficient of thermal expansion of the compensation ring. A continuous range of both positive and negative CTE's are available for $\alpha_3$ and therefore the preferred embodiment offers greater thermal compensation accuracy and control. Further, because the desired CTE may be selected according to wrap angle, fine variations in $\alpha_3$ can be accomplished with very little tooling costs. It is also contemplated that the assembly may be constructed so as to be filled with inert gas before final lens alignment, and thus offers both a degree of mechanical protection and a sealed environment for the beam source.

The invention has been described in detail with particular reference to the preferred embodiments thereof, but it will be understood that variations and modifications can be effected within the spirit and scope of the invention.

What is claimed is:

1. Apparatus for providing athermalized collimation of a light beam source by a light beam collimating means, comprising:

beam source support means for fixing the beam source at a predetermined position thereon and for thereby defining a light beam optical axis;

collimating means support for aligning the collimating means at a beam collimating means position on the optical axis; and thermal compensation means operatively connected between the beam source support means and the collimating means support, the thermal compensation means being operable to selectively displace the collimating means along the optical axis and thereby displace the collimating means, the thermal compensation means comprising a composite laminate construction of fiber strands, wherein the coefficient of thermal expansion $\alpha_3$ of the thermal compensation means is determined by the alignment of the fiber strands.

2. The apparatus of claim 1, wherein the thermal compensation means comprises a compensation ring having plural layers of said fiber strands, wherein the coefficient of expansion $\alpha_3$ is predetermined according to the combination of a respective plurality of predetermined fiber strand wrap angles $\theta$.

3. The apparatus of claim 2, wherein the compensation ring is formed from a composite of plural carbon fibers having a modulus of 33 msi.

4. The apparatus of claim 2, wherein the compensation ring is formed from a composite of graphite/polyphenylene sulfide layers.

5. The apparatus of claim 2, wherein the compensation ring is formed from a composite of layers, each layer comprising plural unidirectional carbon fibers in a Polyphenylene Sulfide matrix, wherein the fibers are laid in a precision wrap configuration.

6. The apparatus of claim 1, wherein the beam source support means further comprises a base plate and the compensation ring is attached to the base plate at a predetermined radius from the optical axis.

7. The apparatus of claim 6, wherein the collimating means support further comprises a front plate formed of material substantially similar to the material forming the base plate.

8. The apparatus of claim 1, wherein the beam source support means further comprises the light beam source mounted in a beam source mount.

9. The apparatus of claim 8, wherein the beam source further comprises a semiconductor laser diode.

10. The apparatus of claim 8, wherein the beam source support means further comprises means for selectively controlling the temperature of the beam source.

11. The apparatus of claim 10, wherein the temperature control means further comprises a thermoelectric cooler (TEC) module.

12. The apparatus of claim 10, wherein the temperature control means further comprises a passive heat sink.

13. Apparatus for providing athermalized collimation of a light beam source by a light beam collimating means, comprising:

beam source support means having a beam source mount for fixing the beam source at a predetermined position thereon and for thereby defining a light beam optical axis;

collimating means support for aligning the collimating means at a beam collimating means position on the optical axis; and compensation ring operatively connected between the beam source support means and the collimating means support the compensation ring being operable to selectively displace the collimating means along the optical axis and thereby displace the collimating means, the compensation ring comprising a composite laminate construction including plural layers of oriented fiber strands, wherein the coefficient of thermal expansion $\alpha_3$ of the compensation ring is predetermined according to the combination of a respective plurality of predetermined fiber strand wrap angles $\theta$.

14. The apparatus of claim 13, wherein the beam source support means further comprises the light beam source mounted in a beam source mount.

15. The apparatus of claim 14, wherein the beam source further comprises a semiconductor laser diode.

16. The apparatus of claim 14, wherein the beam source support means further comprises a thermoelectric cooler module for selectively controlling the temperature of the beam source.

* * * * *